United States Patent [19]

Nunally

[11] Patent Number: 5,025,178

[45] Date of Patent: Jun. 18, 1991

[54] FAULT-RESISTANT SOLID-STATE LINE DRIVER

[75] Inventor: Patrick O. Nunally, Diamond Bar, Calif.

[73] Assignee: General Dynamics Corp., Pomona Div., Pomona, Calif.

[21] Appl. No.: 259,386

[22] Filed: Oct. 18, 1988

[51] Int. Cl.⁵ .............. H03K 19/007; H03K 17/687; H03K 19/094; H03K 17/60

[52] U.S. Cl. .................... 307/442; 307/443; 307/451; 307/571; 307/254; 307/585; 307/296.5; 307/304

[58] Field of Search ............. 307/442, 443, 451, 473, 307/254, 570, 571, 576, 579, 585, 296.5, 304

[56] References Cited

U.S. PATENT DOCUMENTS

| | | | |
|---|---|---|---|
| 4,317,055 | 2/1982 | Yoshida et al. | 307/584 |
| 4,395,774 | 7/1983 | Rapp | 307/576 |
| 4,490,629 | 12/1984 | Barlow et al. | 307/451 |
| 4,700,089 | 10/1987 | Fujii et al. | 307/451 |

Primary Examiner—Stanley D. Miller
Assistant Examiner—Trong Quang Phan
Attorney, Agent, or Firm—Angus C. Fox; Leo J. Carroll

[57] ABSTRACT

A fault-resistant, solid-state line driver having a pair of P-type transistors in series between a bus output and a voltage source, a pair of N-type transistors in series between the bus output and a connection to ground, and a pair of input lines, one of the input lines being connected to both the gate of the P-type transistor closest to the voltage source and the gate of the N-type transistor closest to the bus output, the other input line being connected to both the gate of the P-type transistor closest to the bus output and the gate of the N-type transistor closest to the connection to ground. Such a line driver is particularly useful in devices utilizing wafer-scale levels of integration, as the failure of any one of the driver's transistors will not result in a shorting of the bus output to either ground or the voltage source.

5 Claims, 1 Drawing Sheet

FAULT-RESISTANT SOLID-STATE LINE DRIVER

BACKGROUND OF THE INVENTION

In the field of Metal Oxide Semiconductor (MOS) technology, the trend is toward increasingly complex levels of integration. Monolithic MOS devices incorporating more than 1,000,000 gate equivalents on an entire silicon wafer will soon be a reality. Because of the defects inherent in both the silicon crystal structure and in the component manufacturing process, wafer scale architectures will be based on built-in self-test functions which internally identify and bypass defective portions of the wafer and interconnect the useable ones. Component redundancy will be used to insure that the wafer is useable after defective components have been bypassed.

Several obstacles must be overcome before wafer-scale integration (WSI) can become a practical reality. One of the major problems with WSI is that when paralleling functionally-equivalent devices to increase the number of possibilities of a working portion of the device, it is necessary to connect in parallel the output bit lines of each of those devices. Thus, for example, the output line of the parallel arrangement which bears the first bit of a word must be connected to the first-bit output terminals of each of the other functionally-equivalent devices. It is therefore necessary to use an output architecture which allows the output logic level of a selected device to be unaffected by connection to the output terminals of the other functionally-equivalent devices which have not been selected. This task is commonly accomplished through the use of the standard three-state, dual-transistor line driver shown in FIG. 1. This device has a pair of input lines, 1 and 2. The values input to lines 1 and 2 determine the value of output O, which will be 1 when connected through transistor PQ to the voltage source V, O when connected to connection to ground G through transistor NQ, and O when connected to both V and G through transistors PQ and NQ, respectively. O is isolated from both voltage source V and connection to ground G. This isolated state is commonly referred to as the "tri-state".

The logic table for the standard line driver of FIG. 1 is as follows:

| Inputs: | | |
|---|---|---|
| 1 | 2 | Output (O) |
| 0 | 0 | 1 |
| 0 | 1 | 0 (voltage source and output grounded) |
| 1 | 0 | Tri-state (O isolated from V and G) |
| 1 | 1 | 0 |

The standard, three-state line driver has become a major point of failure in WSI architecture because it is used almost exclusively as a driver at the boundary of functional blocks, where it is connected through its output to a large WSI system bus. Failure of the standard line driver—typically caused by a breakdown in one of the two transistors—will almost invariably destroy the WSI system bus by either grounding it or shorting it to the driver voltage source. The failure modes of the standard line driver is as follows:

| Failure of: | | Effect on |
|---|---|---|
| PQ | NQ | Output (O) |
| no | yes | O grounded |
| yes | no | O shorted to voltage source |

Given the destructive nature of a failed standard line driver, there is a crucial need for an improved three-state line driver which, given a failure of a single transistor therein, will not produce a short between either the voltage source or ground and the bus output.

SUMMARY OF THE INVENTION

The present invention provides a solution to the problem of bus failure brought about by a transistor failure in the standard three-state line driver. The fault-resistant, solid-state line driver differs from the standard three-state driver in that its single transistor failure modes do not affect the output node. This is accomplished by using a push-pull architecture that utilizes both N-type and P-type enhancement transistors in a unique stacked arrangement which dramatically increases the chances of a functional WSI system bus, in the event of a single driver transistor failure. This improved line driver is fully compatible with standard solid-state architectures which utilize CMOS and bipolar fabrication processes and presents no conflict with contemporary circuit design which utilizes the standard three-state driver.

PREFERRED EMBODIMENT OF THE INVENTION

Figure 2:
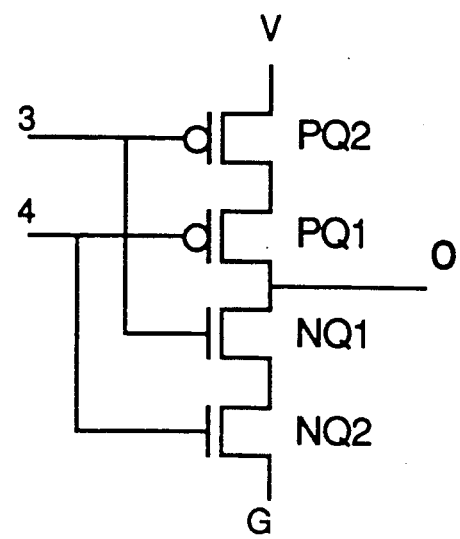
FIG. 2 is a schematic representation of the improved, fault-resistant, four-transistor line driver.

Referring now to FIG. 2, the improved, fault-resistant line driver is constructed by connecting a pair of P-channel enhancement transistors, PQ1 and PQ2, in series between bus output O and a voltage source V, connecting a pair of N-channel enhancement transistors, NQ1 and NQ2, in series between the bus output O and a connection to ground G, connecting input line 3 to both the gate of transistor PQ2 (the P-channel transistor closest to voltage source V) and the gate of transistor NQ1 (the N-channel transistor closest to the bus output) and connecting input line 4 to both the gate of transistor PQ1 (the P-channel transistor closest to the bus output) and the gate of transistor NQ2 (the N-channel transistor closest to the connection to ground G).

The logic table for the improved, four-transistor line driver shown in FIG. 2 is as follows:

| Inputs: | | |
|---|---|---|
| 3 | 4 | Output (O) |
| 0 | 0 | 1 |
| 0 | 1 | Tri-state (O isolated from V and G) |
| 1 | 0 | Tri-state (O isolated from V and G) |
| 1 | 1 | 0 |

Figure 1:
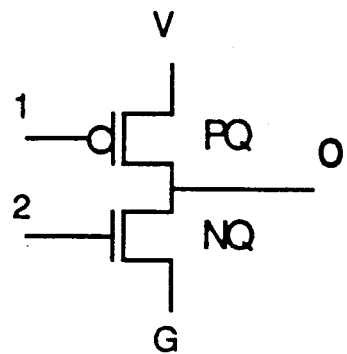
FIG. 1 is a schematic representation of the standard, three-state, dual-transistor line driver.

Although the logic table for this embodiment of the improved line driver is essentially equivalent to that for the standard line driver of FIG. 1, the failure modes of the two devices are very different. The single and double transistor failure modes of the improved line driver of FIG. 2 are as follows:

| Failure of: | | | | Effect on |
|---|---|---|---|---|
| PQ2 | PQ1 | NQ1 | NQ2 | Output (O) |
| no | no | no | yes | Tri-state (O isolated from V and G) |
| no | no | yes | no | " |
| no | yes | no | no | " |
| yes | no | no | no | " |
| yes | no | no | yes | " |
| yes | no | yes | no | " |
| no | yes | no | yes | " |
| no | yes | yes | no | " |
| no | no | yes | yes | O shorted to ground |
| yes | yes | no | no | O shorted to voltage source |

As will be noted from the table above, in no case of a single transistor failure is the line driver output shorted to the voltage source or ground. In addition, even in the case of a two-transistor failure, a bus to which the improved driver is connected has only a one-third probability of being destroyed (assuming the failure rate of all four transistors is equal). As a result of the greatly reduced bus-destroying, failure-mode potential of the improved line driver, the number of interconnectable good wafer portions will be dramatically increased, with a corresponding increase in WSI yields.

Figure 3:
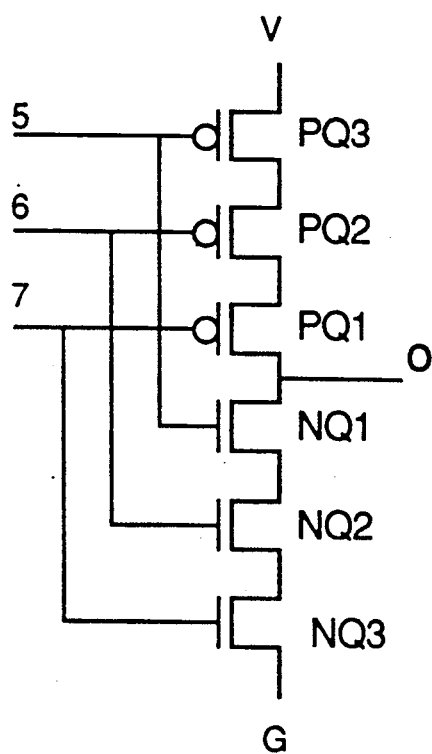
FIG. 3 is a schematic representation of six-transistor version of the improved, fault-resistant line driver.

By adding additional pairs of transistors to the four-transistor fault-resistant line driver, line drivers can be created which are even less likely to short out a WSI system bus. Of course, physical size and circuit complexity are correspondingly increased. The optimum size for a particular application would depend on the number of drivers having an output to the bus, the component failure rate and the seriousness of bus failure. A six-transistor version of the fault-resistant line driver is shown in FIG. 3. When the three inputs, 5, 6 and 7, are all low, the output is high (a closed circuit to V). Conversely, when inputs 5, 6 and 7 are all high, the output is low (grounded). Only in the two cases where all three P-type transistors are shorted or where all three N-type transistors are shorted will this embodiment of the improved line driver result in catastrophic bus failure.

Figure 4:
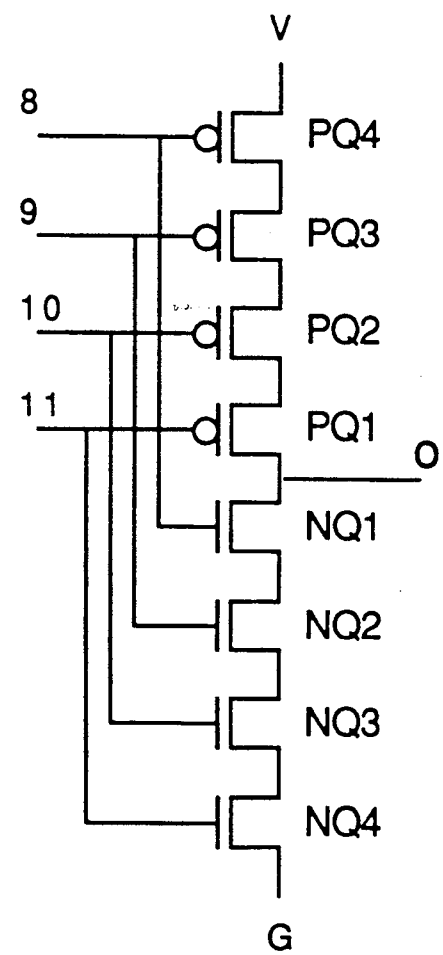
FIG. 4 is a schematic representation of an eight-transistor version of the improved, fault-resistant line driver.

An eight-transistor version of the fault-resistant line driver is shown in FIG. 4. For the output O to be high, all four inputs (8, 9, 10 and 11) must be low; for the output O to be low, all four inputs must be high. For this particular embodiment, only in the two cases where all four P-type transistors are shorted or where all four N-type transistors are shorted will catastrophic bus failure result.

In addition to the combination of N-channel and P-channel enhancement transistors which are used in the preferred embodiment of the invention, either a combination of N-type depletion and P-type depletion transistors or a combination of N-P-N and P-N-P bipolar junction transistors could also be used with satisfactory results.

I claim:

1. An improved, fault-resistant line driver comprising:

a pair of P-type transistors connected in series between a bus output and a voltage source;

a pair of N-type transistors connected in series between the bus output and a connection to ground;

a first input line connecting both the gate of the P-type transistor closest to the voltage source and the gate of the N-type transistor closest to the bus output; and a second input line connecting both the gate of the P-type transistor closest to the bus output and the gate of the N-type transistor closest to the connection to the ground.

2. The device of claim 1, which further comprises:

a third P-type transistor connected in series between said pair of P-type transistors;

a third N-type transistor connected in series between said pair of N-type transistors; and a third input line connected to both the gate of said third P-type transistor and the gate of said third N-type transistor.

3. The device of claim 2, which further comprises:

a fourth P-type transistor connected in series between said third P-type transistor and said P-type transistor closest to the voltage source;

a fourth N-type transistor connected in series between said third N-type transistor and said N-type transistor closest to the bus output; and a fourth input line connected to both the gate of said fourth P-type transistor and the gate of said fourth N-type transistor.

4. The device of claim 3, which further comprises:

a fifth P-type transistor connected in series between said fourth P-type transistor and said P-type transistor closest to the voltage source;

a fifth N-type transistor connected in series between said fourth N-type transistor and said N-type transistor closest to the bus output; and a fifth input line connected to both the gate of said fifth P-type transistor and the gate of said fifth N-type transistor.

5. An improved, short-resistant line driver comprising:

an identical number "n" ("n" being an integer greater than one) of P-type transistors and N-type transistors;

said P-type transistors connected in series between a bus output and a voltage source (for identification purposes, said P-type transistors will be numbered consecutively PQ1, PQ2, . . . PQn-1, PQn; PQ1 being that P-type transistor closest to said bus output);

said N-type transistors connected in series between the bus output and a connection to ground (for identification purposes, said N-type transistors will be numbered consecutively NQ1, NQ2, . . . NQn-1, NQn; NQ1 being that N-type transistor closest to said bus output); a series of n/2 input lines interconnecting said P-type and said N-type transistors;

a first input line of said series connecting both the gate of the transistor PQn and the gate of transistor NQ1;

a second input line of said series connecting both the gate of transistor PQn-1 and the gate of transistor NQ2;

an (n/2-1)th input line of said series connecting both the gate of transistor PQ2 and the gate of transistor NQn-1; and an (n/2)th input line of said series connecting both the gate of transistor PQ1 and the gate of transistor NQn.

* * * * *